United States Patent
Kawai et al.

(10) Patent No.: US 12,279,368 B2
(45) Date of Patent: Apr. 15, 2025

(54) PRINTED WIRING BOARD

(71) Applicant: IBIDEN CO., LTD., Gifu (JP)

(72) Inventors: Satoru Kawai, Ogaki (JP); Katsuhiko Tanno, Ogaki (JP); Susumu Kagohashi, Ogaki (JP); Kentaro Wada, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 415 days.

(21) Appl. No.: 17/823,210

(22) Filed: Aug. 30, 2022

(65) Prior Publication Data
US 2023/0080335 A1    Mar. 16, 2023

(30) Foreign Application Priority Data

Sep. 16, 2021   (JP) .................................. 2021-150860

(51) Int. Cl.
*H05K 1/03*      (2006.01)
*G06T 7/00*      (2017.01)
*H05K 3/46*      (2006.01)

(52) U.S. Cl.
CPC ............. *H05K 1/036* (2013.01); *G06T 7/001* (2013.01); *H05K 3/4644* (2013.01);
(Continued)

(58) Field of Classification Search
CPC . G06T 2207/10061; G06T 2207/30141; G06T 7/001; H05K 1/036; H05K 1/0373;
(Continued)

(56) References Cited

U.S. PATENT DOCUMENTS 4,859,571 A * 8/1989 Cohen ................... H05K 3/184
                                          430/311
5,240,761 A * 8/1993 Calhoun ................... C09J 7/10
                                          428/164

(Continued)

FOREIGN PATENT DOCUMENTS

JP         2012-186440 A    9/2012

OTHER PUBLICATIONS

Genjin Mago, "Build-up Material for IC Package Substrates", Japan Rubber Association Journal vol. 84 No. 10 (2011), with English Translation (https://www.jstage.jst.go.jp/article/gomu/84/10/84_10_321/_pdf).

*Primary Examiner* — William H. Mayo, III
*Assistant Examiner* — Rhadames Alonzo Miller
(74) *Attorney, Agent, or Firm* — Oblon, McClelland, Maier & Neustadt, L.L.P.

(57) ABSTRACT

A printed wiring board includes a resin insulating layer including resin and particles, and a conductor layer formed on a surface of the resin insulating layer. The particles in the resin insulating layer include first particles and second particles such that the first particles are partially embedded in the resin and the second particles are completely embedded in the resin, and the resin insulating layer is formed such that the first particles has exposed surfaces exposed from the resin and covered surfaces covered by the resin, respectively, the surface of the resin insulating layer includes the first exposed surfaces, and a ratio of a second area to a first area is in a range of 0.1 to 0.25 where the first area is an area of the surface of the resin insulating layer, and the second area is obtained by summing areas of the exposed surfaces of the first particles.

20 Claims, 2 Drawing Sheets

(52) U.S. Cl.
CPC ............... *G06T 2207/10061* (2013.01); *G06T 2207/30141* (2013.01); *H05K 2201/0212* (2013.01)

(58) Field of Classification Search
CPC ... H05K 2201/0212; H05K 2201/0272; H05K 3/38; H05K 3/4644
See application file for complete search history.

(56) References Cited

U.S. PATENT DOCUMENTS

| | | | |
|---|---|---|---|
| 5,882,954 A * | 3/1999 | Raghava | H01L 21/4846 438/106 |
| 2006/0280912 A1* | 12/2006 | Liang | H01B 1/22 428/173 |
| 2010/0101700 A1* | 4/2010 | Liang | B32B 27/40 156/73.6 |
| 2013/0082368 A1* | 4/2013 | Kim | H01L 23/3135 257/659 |
| 2014/0141195 A1* | 5/2014 | Liang | C09J 9/02 428/98 |
| 2015/0240130 A1* | 8/2015 | Liang | C09J 7/20 428/206 |
| 2017/0140847 A1* | 5/2017 | Kamikoriyama | H05K 1/09 |
| 2020/0006203 A1* | 1/2020 | Marin | H01L 23/4924 |
| 2021/0014978 A1* | 1/2021 | Hashizume | H05K 3/022 |

* cited by examiner

PRINTED WIRING BOARD

CROSS-REFERENCE TO RELATED APPLICATIONS

The present application is based upon and claims the benefit of priority to Japanese Patent Application No. 2021-150860, filed Sep. 16, 2021, the entire contents of which are incorporated herein by reference.

BACKGROUND OF THE INVENTION

Field of the Invention

The present invention relates to a printed wiring board that includes a resin insulating layer and a conductor layer.

Description of Background Art

The publication, "Build-Up Material for Semiconductor Package Substrate" (Source: Japan Rubber Association Journal Vol. 84 No. 10 (2011), https://www.jstage.jst.go.jp/article/gomu/84/10/84_10_321/_pdf), describes a build-up material used for a semiconductor package substrate. In Japanese Patent Application Laid-Open Publication No. 2012-186440, ABF-GX13GC manufactured by Ajinomoto Fine-Techno Co., Ltd. is used as a material for filler and an insulating layer. The entire contents of these publications are incorporated herein by reference.

SUMMARY OF THE INVENTION

According to one aspect of the present invention, a printed wiring board includes a resin insulating layer including resin and particles, and a conductor layer formed on a surface of the resin insulating layer. The particles in the resin insulating layer include first particles and second particles such that the first particles are partially embedded in the resin and that the second particles are completely embedded in the resin, and the resin insulating layer is formed such that the first particles has exposed surfaces exposed from the resin and covered surfaces covered by the resin, respectively, that the surface of the resin insulating layer includes the first exposed surfaces, and that a ratio of a second area to a first area is in a range of 0.1 to 0.25 where the first area is an area of the surface of the resin insulating layer, and the second area is obtained by summing areas of the exposed surfaces of the first particles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
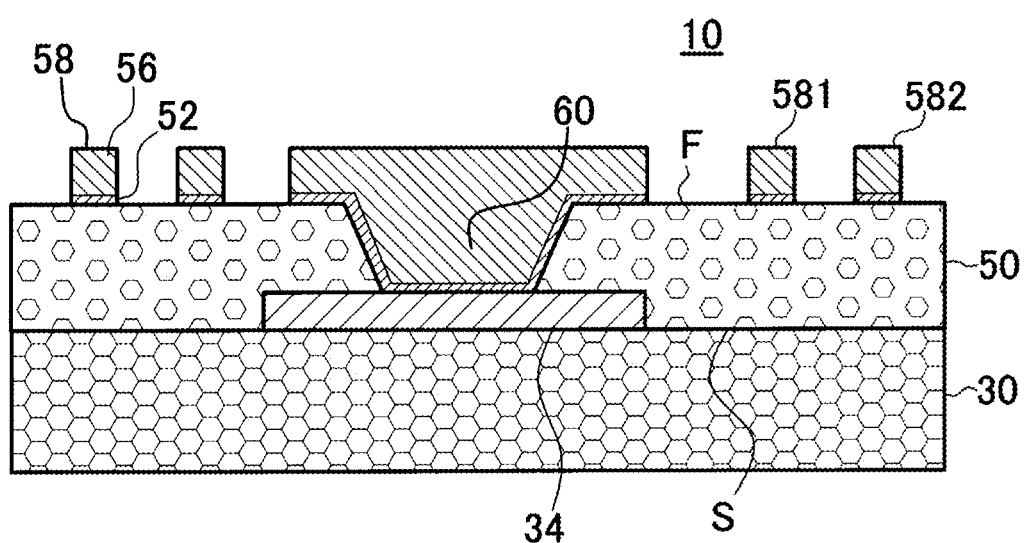
FIG. 1 is a cross-sectional view of a printed wiring board according to an embodiment of the present invention.

Embodiments will now be described with reference to the accompanying drawings, wherein like reference numerals designate corresponding or identical elements throughout the various drawings.

FIG. 1 is a cross-sectional view of a printed wiring board 10 according to an embodiment of the present invention.

Figure 2A:
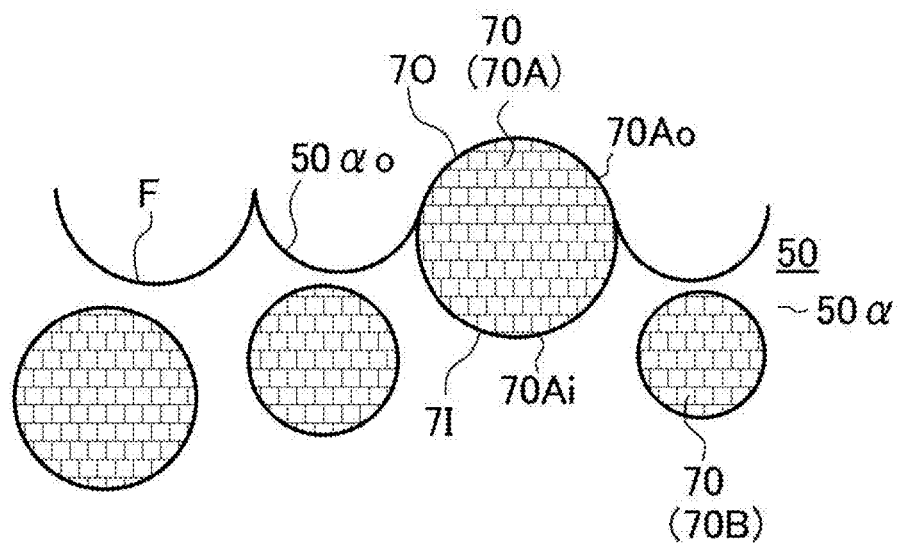
FIG. 2A is a schematic diagram of a cross section of a resin insulating layer.

The printed wiring board 10 includes a resin insulating layer 50, which has a first surface (F) and a second surface (S) on the opposite side with respect to the first surface (F), and a conductor layer (first conductor layer) 58, which is formed on the first surface (F) of the resin insulating layer 50. The first conductor layer 58 is in contact with the first surface (F). As illustrated in FIG. 2A, the resin insulating layer 50 is formed of a resin (50a) and particles 70. Examples of the resin (50a) include an epoxy resin and a polyimide resin. The particles 70 are inorganic particles. Examples of the particles 70 include silica particles and alumina particles. Each of the particles 70 has a spherical shape. For example, the resin insulating layer 50 is formed on a core substrate 30 and on a second conductor layer 34 on the core substrate 30. The first conductor layer 58 and the second conductor layer 34 are connected via a via conductor 60 penetrating the resin insulating layer 50.

An amount of the particles 70 in the resin insulating layer 50 is 60 wt % or more and 90 wt % or less. The particles 70 have an average particle diameter of 0.2 μm or more and 5.0 μm or less.

FIG. 2A is an enlarged view near the first surface (F) of the resin insulating layer 50. FIG. 2A illustrates the resin (50α) and the particles 70. The particles 70 include first particles (70A), each of which is partially embedded in the resin (50α), and second particles (70B), each of which is completely embedded in the resin (50α). Each of the first particles (70A) is partially exposed to outside. Of each of the first particles (70A), a portion exposed to the outside is an exposed portion (7O), and a portion embedded in the resin (50α) is an embedded portion (7I). A surface of each of the first particles (70A) is formed of a surface (first exposed surface) (70Ao) exposed to the outside and a surface (covered surface) (70Ai) covered by the resin (50α). The first exposed surface (70Ao) is a surface of the exposed portion (7O). The covered surface (70Ai) is a surface of the embedded portion (7I). The resin (50α) has a surface (second exposed surface) (50αo) of a resin exposed to the outside. The first surface (F) is formed of the first exposed surfaces (70Ao) and the second exposed surface (50αo).

In the embodiment, an area of the first exposed surface (70Ao) of each of the first particles (70A) is measured. A value obtained by summing the areas (first exposed areas) of the first exposed surfaces (70Ao) of the first particles (70A) is a second area. The second area is represented by summing the areas of the first exposed surfaces (70Ao) of the first particles (70A).

In the embodiment, an area of the first surface (F) is measured. The area of the first surface (F) is a first area. The first area is obtained by summing the second area and an area (second exposed area) of the second exposed surface (50αo).

For example, the first exposed areas and the second exposed area are determined using a two-dimensional image of the first surface (F). Or, the first and second exposed areas are determined using a three-dimensional shape of the first surface (F). Examples of two-dimensional images include SEM images and photomicrographs. A three-dimensional shape is determined using a three-dimensional measuring device. For example, a three-dimensional shape may be measured using a laser displacement sensor.

When the first area and the second area are determined using a two-dimensional image, each of the first area and the second area is represented by a plane area.

When the first area and the second area are determined using a three-dimensional shape, each of the first area and the second area is represented by a surface area.

A method for determining an area using an SEM image is described below.

Figure 2B:
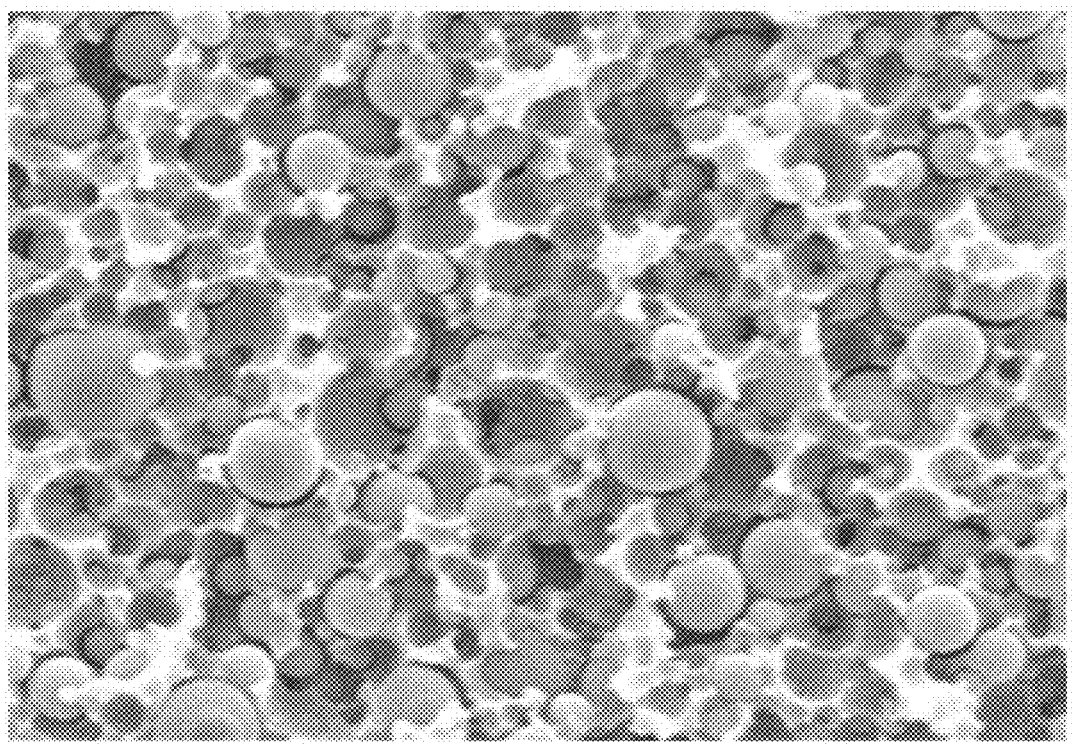
FIG. 2B is an SEM image of a first surface.

FIG. 2B is an SEM image of the first surface (F) of the resin insulating layer 50. A magnification of the SEM image shown in FIG. 2B is 10,000×. FIG. 2B is a top view of the first surface (F).

Areas (first exposed areas) of the first exposed surfaces (70Ao) of the first particles (70A) in the SEM image shown in FIG. 2B are determined. After that, the second area is determined by summing the first exposed areas. Each of the first exposed surfaces (70Ao) is recognized as a plane. For example, a shape of each of the first exposed surfaces (70Ao) is recognized as a circle. In this case, an area of each of the first exposed surfaces (70Ao) is an area of a circle.

For example, the area of the first surface (F) (the first area) is determined using the SEM image shown in FIG. 2B. The area of the first surface (F) determined using the SEM image is a representative value of the first area. The first surface (F) is recognized as a plane. For example, a shape of the first surface (F) is recognized as a rectangle. In this case, the area of the first surface (F) is an area of the rectangle.

The number of SEM images for determining the first area and the second area is preferably more than one. For example, the number of SEM images is ten. For example, the first area is represented by averaging values obtained from the SEM images. The second area is represented by averaging values obtained from the SEM images.

When the first area and the second area are determined using a 3D shape, the number of measurement targets is ten. Each of the first area and the second area is an average value of 10 data.

A value obtained by dividing the second area by the first area is a first ratio ((the second area)/(the first area)). The first ratio is 0.1 or more and 0.25 or less. In the case of multiple images, the first ratio obtained from each of the imaged is preferably 0.1 or more and 0.25 or less. A large portion of the first surface (F) is formed of the resin (50α). Therefore, the first conductor layer 58 is unlikely to peel off from the first surface (F) of the resin insulating layer 50. For example, when the first ratio is less than 0.1, a thermal expansion coefficient of the first surface (F) in contact with the first conductor layer 58 is large. Due to a thermal stress, the first conductor layer 58 is likely to peel off from the first surface (F). When the first ratio exceeds 0.25, an amount of the resin (50α) forming the first surface (F) is small. Due to a thermal stress, the first conductor layer 58 is likely to peel off from the first surface (F) of the resin insulating layer 50.

A relative permittivity of the resin (50α) and a relative permittivity of the particles 70 are different from each other. Therefore, it is thought that a relative permittivity of the first surface (F) is not uniform. It is thought that the relative permittivity of the first surface (F) varies depending on a location. When the first conductor layer 58 formed on the first surface (F) includes multiple signal wirings (581, 582), the signal wirings (581, 582) are in contact with the first surface (F). It is thought that, when the relative permittivity of the first surface (F) is not uniform, a difference in transmission speed between the signal wirings (581, 582) is large. It is thought that, when a length of each of the signal wirings (581, 582) exceeds 5 mm, the difference in transmission speed affects a malfunction of an IC chip mounted on the printed wiring board 10. When the length of each of the signal wirings (581, 582) is 10 mm or more and 25 mm or less, a frequency of malfunctions is expected to be high. However, in the embodiment, since the first ratio is 0.1 or more and 0.25 or less, the difference in transmission speed is small. The frequency of occurrence of malfunctions is reduced.

An arithmetic mean roughness (Ra) of the first surface (F) of the resin insulating layer 50 is 0.01 μm or more and 0.5 μm or less. A ten-point mean roughness (Rz) of the first surface (F) of the resin insulating layer 50 is 2.0 μm or less. Even when the roughness of the first surface (F) of the resin insulating layer 50 is small, since the first ratio is 0.1 or more and 0.25 or less, a thickness of a chemical copper 52 forming the first conductor layer 58 is reduced. A first conductor layer 58 having high-density wirings is obtained. Since the roughness of the first surface (F) is small, a transmission loss of the signal wirings (581, 582) in the first conductor layer 58 is reduced. Examples of the roughness are the arithmetic mean roughness (Ra) and the ten-point mean roughness (Rz). The first conductor layer 58 is formed of the chemical copper 52 and an electrolytic copper 56 on the chemical copper 52, and the chemical copper 52 is in contact with the first surface (F).

In the printed wiring board of the embodiment, a second ratio of a surface area (first surface area) of the first exposed surfaces (70Ao) to a surface area (second surface area) of the covered surfaces (70Ai) ((the first surface area)/(the second surface area)) is less than 0.5. The second ratio is more desirably 0.35 or less. The second ratio is optimally 0.2 or less. The second ratio is inferred from the cross-sectional view illustrated in FIG. 2A. Using FIG. 2A, an area of an exposed portion (7O) and an area of embedded portion (7I) of one first particle (70A) are determined. The second ratio and a ratio ((the area of the exposed portion (7O))/(the area of the embedded portion (7I))) are substantially equal to each other. The second ratio is represented by the ratio ((the area of the exposed portion (7O))/(the area of the embedded portion (7I))).

The first ratio is controlled by the amount of the inorganic particles 70 in the resin insulating layer 50. When the resin insulating layer 50 is irradiated with a CF4 gas, the resin (50α) in the resin insulating layer 50 is selectively removed. A portion of the surfaces of the inorganic particles 70 forms the first surface (F). For example, the first ratio and the second ratio are controlled by adjusting a gas irradiation time. The first ratio and the second ratio may be controlled by adjusting a gas concentration. The first surface (F) may be roughened using an oxidizing agent.

The publication, "Build-Up Material for Semiconductor Package Substrate" (Source: Japan Rubber Association Journal Vol. 84 No. 10 (2011), https://www.jstage.jst.go.jp/article/gomu/84/10/84_10_321/_pdf), describes a build-up material used for a semiconductor package substrate. ABF is introduced in Table 2 as an example of a build-up material. Then, in the publication, a surface of an insulating resin is chemically etched in order to ensure adhesion to a copper plating. In the publication, unevenness is formed on the surface of the insulating resin by etching the surface of the insulating resin with permanganate. In Japanese Patent Application Laid-Open Publication No. 2012-186440, ABF-GX13GC manufactured by Ajinomoto Fine-Techno Co., Ltd. is used as a material for filler and an insulating layer.

According to Japanese Patent Application Laid-Open Publication No. 2012-186440, filler contains glass particles. Therefore, it is thought that ABF-GX13GC has glass particles. Further, ABF manufactured by Ajinomoto Fine-Techno Co., Ltd. is widely used as a resin insulating layer. Therefore, it is thought that ABF containing glass particles is widely used for resin insulating layers. The publication describes that a resin with high affinity has the following tendencies. A highly hydrophilic resin is selectively etched. It is thought that, when ABF containing glass particles is etched, a highly hydrophilic resin is selectively etched. And, it is thought that the glass particles are hardly etched. Therefore, when adhesion strength between a plating film and a resin is compared with adhesion strength between a plating film and glass particles, the latter is expected to be low. Therefore, it is thought that the glass particles affect the adhesion strength between the plating film and the resin insulating layer. It is thought that, when too many glass particles are contained in the resin insulating layer, the plating film may peel off from the resin insulating layer.

A printed wiring board according to an embodiment of the present invention includes: a resin insulating layer that has a first surface and a second surface on the opposite side with respect to the first surface; and a conductor layer that is formed on the first surface of the resin insulating layer. The resin insulating layer is formed of a resin and particles. The particles include first particles that are partially embedded in the resin and second particles that are completely embedded in the resin. A surface of each of the first particles is formed of a surface exposed to outside (first exposed surface) and a surface covered by the resin (covered surface). The first surface includes the first exposed surfaces. A first ratio ((second area)/(first area)) of an area (second area), which is obtained by summing areas of the first exposed surfaces of the first particles, to an area (first area) of the first surface is 0.1 or more and 0.25 or less.

In a printed wiring board according to an embodiment of the present invention, the first ratio ((second area)/(first area)) is 0.1 or more and 0.25 or less. A large portion of the first surface is formed of the resin. Therefore, a conductor circuit on the first surface is unlikely to peel off from the resin insulating layer. For example, when the first ratio is less than 0.1, a thermal expansion coefficient of the first surface in contact with a conductor circuit is large. The conductive circuit is likely to peel off from the first surface due to a thermal stress. When the first ratio exceeds 0.25, an amount of the resin forming the first surface is small. The conductive circuit is likely to peel off from the first surface due to a thermal stress.

A relative permittivity of the resin and a relative permittivity of the particles are different from each other. Therefore, it is thought that a relative permittivity of the first surface is not uniform. It is thought that the relative permittivity of the first surface varies depending on a location. When the conductor layer formed on the first surface includes multiple signal wirings, the signal wirings are in contact with the first surface. It is thought that, when the relative permittivity of the first surface is not uniform, a difference in transmission speed between the signal wirings is large. It is thought that, when a length of each of the signal wirings exceeds 5 mm, the difference in transmission speed affects a malfunction of an IC chip mounted on the printed wiring board. When the length of each of the signal wirings is 10 mm or more and 25 mm or less, a frequency of malfunctions is expected to be high. However, in the embodiment, since the first ratio is 0.1 or more and 0.25 or less, the difference in transmission speed is small. The frequency of occurrence of malfunctions is reduced.

When the first ratio is 0.1 or more and 0.25 or less, even when a chemical copper forming the conductor layer is thin, adhesion between the conductor layer and the resin insulating layer is ensured. Even when a signal wiring has a small width, adhesion strength between the signal wiring and the resin insulating layer satisfies a target value. Even when a signal wiring has a width of 8 µm or less, the signal wiring is unlikely to peel off from the resin insulating layer. Even a signal wiring has a width of 3 µm or more, the signal wiring is unlikely to peel off from the resin insulating layer.

When the first ratio is 0.1 or more and 0.25 or less, roughness of the resin forming the first surface is reduced. A transmission loss of a conductor circuit in contact with the first surface is reduced.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a resin insulating layer comprising resin and particles; and
a conductor layer formed on a surface of the resin insulating layer,
wherein the particles in the resin insulating layer include first particles and second particles such that the first particles are partially embedded in the resin and that the second particles are completely embedded in the resin, and the resin insulating layer is formed such that the first particles has exposed surfaces exposed from the resin and covered surfaces covered by the resin, respectively, that the surface of the resin insulating layer includes the first exposed surfaces, and that a ratio of a second area to a first area is in a range of 0.1 to 0.25 where the first area is an area of the surface of the resin insulating layer, and the second area is obtained by summing areas of the exposed surfaces of the first particles.

2. The printed wiring board according to claim 1, wherein the resin insulating layer is formed such that the surface includes a second exposed surface of the resin such that the surface is formed of the exposed surfaces of the first particles and the second exposed surface of the resin.

3. The printed wiring board according to claim 2, wherein the resin insulating layer is formed such that a second ratio of first surface area to a second surface area is less than 0.5 where the first surface area is a surface area of the exposed surfaces of the first particles, and the second surface area is a surface area of the covered surfaces of the first particles.

4. The printed wiring board according to claim 3, wherein the resin insulating layer is formed such that the second ratio is 0.35 or less.

5. The printed wiring board according to claim 3, wherein the resin insulating layer is formed such that the second ratio is 0.2 or less.

6. The printed wiring board according to claim 1, wherein the first ratio is determined by taking at least one image of the surface of the resin insulating layer, and determining the first area and the second area in the at least one image.

7. The printed wiring board according to claim 6, wherein the first ratio is determined such that a magnification of the at least one image is 10,000×.

8. The printed wiring board according to claim 6, wherein the first ratio is determined such that the at least one image comprises 10 images and that the first ratio is an average of values determined from of the 10 images.

9. The printed wiring board according to claim 6, wherein the first ratio is determined such that the at least one image comprises 10 images and that the first ratio determined from each of the 10 images is in a range of 0.1 to 0.25.

10. The printed wiring board according to claim 6, wherein the first ratio is determined such that the second area is represented by summing areas of the exposed surfaces of the first particles in the at least one image.

11. The printed wiring board according to claim 10, wherein the first ratio is determined such that the first area is represented by an area measured from the at least one image.

12. The printed wiring board according to claim 11, wherein the first ratio is determined such that the at least one image is at least one two-dimensional image, that the first area and the second area are not surface areas, and that the first area and the second area are determined using the at least one two-dimensional image.

13. The printed wiring board according to claim 12, wherein the first ratio is determined such that when a shape of the at least one image is a rectangle, the first area is an area of the rectangle and that when a shape of the first exposed surface is represented by a circle, an area of the first exposed surface is an area of the circle.

14. The printed wiring board according to claim 2, wherein the first ratio is determined by taking at least one image of the surface of the resin insulating layer, and determining the first area and the second area in the at least one image.

15. The printed wiring board according to claim 14, wherein the first ratio is determined such that a magnification of the at least one image is 10,000×.

16. The printed wiring board according to claim 14, wherein the first ratio is determined such that the at least one image comprises 10 images and that the first ratio is an average of values determined from of the 10 images.

17. The printed wiring board according to claim 14, wherein the first ratio is determined such that the at least one image comprises 10 images and that the first ratio determined from each of the 10 images is in a range of 0.1 to 0.25.

18. The printed wiring board according to claim 14, wherein the first ratio is determined such that the second area is represented by summing areas of the exposed surfaces of the first particles in the at least one image.

19. The printed wiring board according to claim 18, wherein the first ratio is determined such that the first area is represented by an area measured from the at least one image.

20. The printed wiring board according to claim 19, wherein the first ratio is determined such that the at least one image is at least one two-dimensional image, that the first area and the second area are not surface areas, and that the first area and the second area are determined using the at least one two-dimensional image.

* * * * *